INVENTOR.
ROBERT A. MOOG
BY
Alfred W. Barber
ATTORNEY

Oct. 28, 1969 R. A. MOOG 3,475,623

ELECTRONIC HIGH-PASS AND LOW-PASS FILTERS EMPLOYING THE BASE TO EMITTER DIODE RESISTANCE OF BIPOLAR TRANSISTORS

Filed Oct. 10, 1966 4 Sheets-Sheet 2

INVENTOR.
ROBERT A. MOOG
BY Alfred W. Barber
ATTORNEY

INVENTOR.
ROBERT A. MOOG
BY
Alfred W. Barber
ATTORNEY

INVENTOR.
ROBERT A. MOOG
BY
Alfred W. Barber
ATTORNEY

United States Patent Office 3,475,623
Patented Oct. 28, 1969

3,475,623

ELECTRONIC HIGH-PASS AND LOW-PASS FILTERS EMPLOYING THE BASE TO EMITTER DIODE RESISTANCE OF BIPOLAR TRANSISTORS

Robert A. Moog, Box X, Trumansburg, N.Y. 14886
Filed Oct. 10, 1966, Ser. No. 585,601
Int. Cl. H03k 5/20; G06g 7/12
U.S. Cl. 307—233 16 Claims

ABSTRACT OF THE DISCLOSURE

The dynamic base to emitter resistance of bipolar transistors is programmable over a wide range by varying the standing current in the transistors. Voltage programmable high-pass and low-pass RC filters are formed using a plurality of bipolar transistors connected to use the base to emitter diode resistance as the R's of the filters.

The present invention concerns electronic filters and, in particular, electronic low-pass and electronic high-pass filters including novel ocntrol and coupling circuitry.

Networks of resistors and capacitors have long been utilized as low-pass or high-pass filters. Filters having variable cut-off frequencies have been constructed by making either the resistors or the capacitors variable, or both. In prior art devices, generally, the variable resistors and variable capacitors have been physical components of familiar form. The variable resistors or variable capacitors have sometimes been ganged to provide single control means for varying the cut-off frequencies.

There have been some attempts to provide electronic circuit elements in R-C filters such as variable capacitor diodes. However, there has not been as far as is known, a generalized filter network suitable for low-pass or high-pass filter use employing true electronic circuit elements.

It has been found in accordance with the present invention that the variable dynamic resistance of the emitter-base diodes of a pair of silicon transistors can be utilized in R-C filters and that this resistance can be controlled by changing the standing currents in these transistors.

The low-pass filter section in accordance with the present invention includes seven portions, namely: adder, signal input buffer, filter input, filter, filter output, signal output buffer and feedback loop. The adder portion is a conventional analog adder with three (for example) inputs, an operational amplifier and a feedback resistor. The output of this adder is proportional to the sum of the input voltages applied to the three inputs. The constant of proportionality is the closed loop gain of the operational amplifier. This output is applied to the emitter of a transistor forming part of the filter input. The base of this input transistor is maintained at a constant voltage by being connected to a forward-biased diode having a junction similar to the base-emitter junction of the input transistor and thereby also providing temperature compensation.

The input transistor just described is a silicon junction transistor in which the volt-ampere characteristic of its input diode is exponential over a very wide current range. Thus, its emitter current is proportional to the exponential of the emitter voltage from the operational amplifier. Because of its high current gain, its collector current is very nearly equal to its emitter current. This collector current is divided equally between two filter driver transistors forming a matched pair. These two driver transistors are connected in a push-pull common emitter configuration to drive a string of transistors which provide the dynamic resistance elements of the filter. The bases of the two driver transistors are supplied with the signals to be filtered through an input buffer. The gain of the input buffer is set so that the base-to-base variation creates a collector current variation which is small compared with the standing collector current. The input buffer excites the driver transistors from a low impedance. Because of the exponential current-to-voltage characteristics of the driver transistors, the collector current variations are a certain percentage of their standing currents. This percentage remains constant through wide variations in the standing current created by the changes in input signal from the input transistor. Moreover, the collector-to-collector impedance of the driver transistors is very high and therefore they serve as a nearly perfect current source for the filter transistors.

The filter portion of the present invention includes four identical sections each comprising a fixed capacitor and two transistors whose input diodes are effectively in series. The current gains of these transistors are all very high so that their collector currents are defined largely by the collector current from the driver transistors. Because of the exponential relationship between the standing current and the voltage across the input diodes of these filter transistors, the dynamic resistance from emitter to emitter of each of the filter transistor pairs is inversely proportional to the standing current. The cutoff frequency of each filter section is $f_c = \frac{1}{2}\ rc$ where $r$ is the dynamic resistance of the two base-emitter diodes in series and $c$ is the capacity of the emitter-to-emitter connected capacitors. At frequencies low compared to the cutoff frequency, nearly all of the signal current flows into the emitters of the filter transistors. At frequencies high compared to the cutoff frequency the signal is bypassed by the emitter-to-emitter capacitors.

The outputs of a given transistor pair are very high impedance and provide a nearly perfect current source for the following pair of the cascaded four pairs forming the filter proper. The bases of the filter transistors are biased by a resistor chain so that each transistor is appropriately forward biased.

The final pair of transistors in the filter feed directly into the emitters of a pair of output coupling transistors. The emitter-to-emitter dynamic resistance of these output coupling transistors is inversely propositional to their standing currents. Thus, the signal voltage appearing across their two emitters remains constant (in the limit of very low frequency) through wide variations in the standing current, although the signal current is proportional to the standing current.

The emitter-to-emitter signal voltage of the filter output coupling transistors is applied to the output buffer amplifier. The gain of this buffer amplifier is set so that for very low frequencies, the final signal output voltage equals the signal input voltage to the input buffer. The polarity of the signal output at very low frequencies is opposite to that of the input signal. A variable feedback resistor may be connected from output to input thereby decreasing the overall gain of the filter circuit at very low frequencies. However, at the cutoff frequency, each filter stage contributes a phase shift of 45° and the final output signal is in phase with the initial input signal. Thus, the addition of the feedback resistor changes the filter mode from pure low-pass to resonant. If the feedback is made sufficient, the filter will oscillate and becomes a phase shift oscillator with four voltage-variable phase-shifting sections.

The high-pass filter includes five portions as follows: adder, inverter, signal input driver, filter proper, and output amplifier. The adder portion is an operational amplifier adder with three voltage inputs, for example, the output of which is proportional to the sum of the input (control) voltages plus the voltage across a diode which defines the operating point for the filter and provides temperature compensation. The inverter which follows comprises a unity gain operational amplifier receiving the output from the adder. The filter proper includes four identical stages each comprising a pair of transistors, a capacitor and a unity gain amplifier. The transistors of a given pair are complementary, one being PNP and the other NPN. The bases of all the NPN transistors are connected together and to the output of the adder. The bases of all the PNP transistors are connected together and to the output of the inverter. The base voltages are equal and in the absence of input control voltages are equal to the voltage across the diode and this is the operating point voltage for the active filter transistors. The change in diode voltage with temperature matches and compensates for the base-emitter voltage change with temperature of the filter transistors. The emitters of the two transistors in a given stage are connected together. Thus, the dynamic resistance at the junction of the two emitters is equal to the parallel dynamic resistance of the input diodes (base-emitter) of the two transistors. An amplifier of unity gain is connected between each stage and the stage following it, so that each stage acts as an unloaded filter.

The first filter stage receives its signal from an input driver which in turn receives an input consisting of the signals to be filtered. This input driver provides input signal voltage to the filter at the proper level and at a low impedance. The output of the last stage of the filter proper is fed into an output coupling amplifier having a high input impedance. The gain of this amplifier is set so that, for frequencies well above the cutoff frequency of the filter proper, the net gain from signal input to signal output is unity.

This high-pass filter, although differing somewhat from the low-pass filter in configuration, possesses all of the novel features of the low-pass filter. The circuit is completely balanced so that control voltage variations do not appear at the output. The cutoff frequency is proportional to the exponential of the sum of the input control voltages applied to the adder. This arises from the fact that the voltage difference between the bases of the two transistors in a given filter stage is proportional to the sum of the input control voltages and the current through these transistors is proportional to the exponential of the voltage difference. This exponential relationship is a property of the transistors and is accurate over an extremely wide frequency range of the order of 1000:1.

The filter coupler section includes two portion; the control current network and the signal switching network. This coupler makes it possible to define the center frequency of a pass band or reject band with one single control voltage and the percentage bandwidth with another single control voltage.

This control current network supplies currents to the control nodes of the adders of the low-pass and high-pass filter sections. These currents are established by applying control voltages through large resistances to the inputs of the adders. One control voltage is aplied to control the center frequency, by passing it through one resistor to control the high-pass and another resistor to control the low-pass filters. Thus, a change in center frequency control voltage changes the cutoff frequencies of both the low-pass and the high-pass filters so that the frequency region between the two cutoff frequencies remains fixed in percentage bandwidth. The bandwidth control voltage is applied through a resistor to the high-pass filter adder and to an inverter (operational amplifier) having unity closed loop gain. The output of this inverter is applied through a resistor to the input adder of the low-pass filter. Thus, an increase in the bandwidth control voltage causes the lower cutoff frequency to move in the opposite direction to the upper cutoff frequency. The mean frequency between the two cutoff frequencies, however, remains constant.

The operating modes are selected by means of a three position switch. The control voltages are applied when this switch is in either the first or third position. No control voltages are applied when the switch is in its middle position. This same switch is used to connect the signal inputs and outputs of the high and low-pass filters so that; in its first position, the two filters are effectively in parallel and the circuit operates as a band-rejection filter; in its third position, the two filters are in series and the circuit operates as a band-pass filter.

The present invention has many important advantages. Because of balanced configurations, the filters input control variations do not appear at the outputs. The cutoff frequency of the filters are proportional to the exponential sum of the control input voltages. This feature is of particular significance in musical uses. A musical interval is expressed as a ratio between two frequencies. Thus, increasing the control input voltage a fixed amount will increase the musical interval by a fixed amount. The exponential relationship also has technical and scientific usefulness. The filters have an extremely wide range (1000:1) in cutoff frequencies. They are thus able to continuously cover ranges not possible with conventional filters. The introduction of feedback in the low-pass filter changes its mode from low-pass to resonant and even to oscillatory. The amount of feedback, and hence the mode, may be controlled with a passive variable resistor or with a voltage-controlled amplifier providing great flexibility.

Accordingly, one object of the present invention is to provide methods of and means for filtering complex signals by means of electronic filters which are voltage controlled over a wide range of characteristics.

Another object is to provide an electronic filter in which input control signals are balanced in the filter so that they do not appear in the output.

Still another object is to provide a combination of high-pass and low-pass filters which can be voltage controlled to provide a wide range of characteristics in either band-pass or band-reject modes.

A still further object is to provide both high-pass and low-pass filters with voltage control and feedback control capable of changing the operating mode from high or low-pass to resonant and even to oscillatory modes.

A further object is to provide high and low-pass filters which may be voltage controlled and in which the cutoff frequency remains fixed in the presence of control which causes the filters to peak and even oscillate, by utilizing a four-stage design for both filters.

These and other objects will be apparent from the detailed description of the invention given in connection with the various figures of the drawing.

Figure 1:
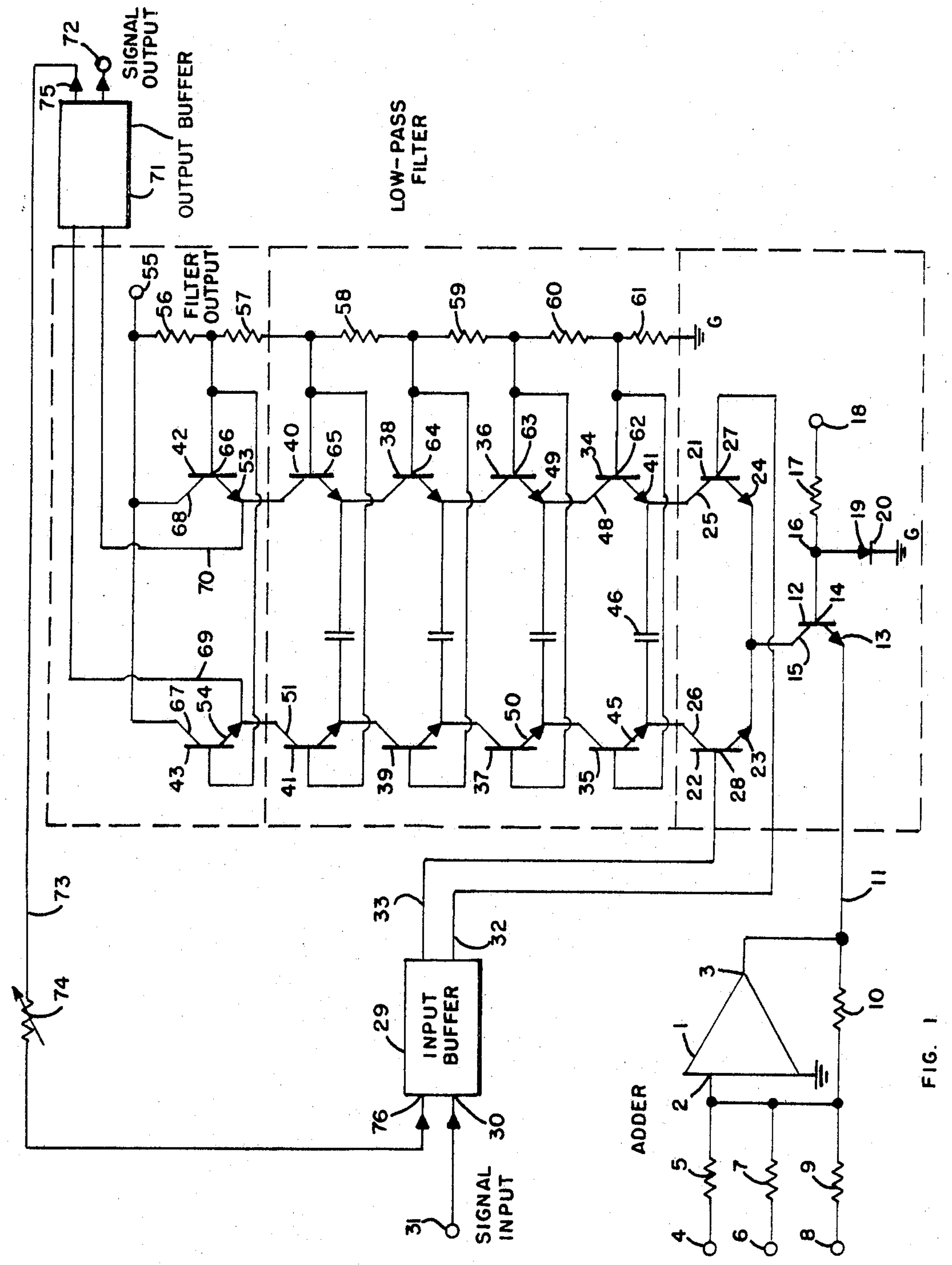
FIGURE 1 is a circuit diagram partly in block form of the low-pass portion of the present invention.

In FIGURE 1 an input adder comprising an operational amplifier including an inverting input terminal 2 and an output terminal 3 receives control inputs at terminals 4, 6 and 8 which are applied through resistors 5, 7 and 9 respectively to input 2 and a feedback resistor 10 connected from output 3 to input 2. The output of adder 1 is applied over lead 11 to emitter 13 of filter input transistor 12. Base 14 is connected to junction 16 between current limiting resistor 17 and diode 19–20. This series circuit is provided with bias voltage, not shown, applied at terminal 18. Diode 19–20 sets the operating point of transistor 12 and provides a temperature response equal and opposite to the base-emitter drop in transistor 12 thereby providing temperature compensation to transistor 12. Collector 15 drives emitters 23 and 24 of filter drive transistors 21 and 22. Bases 27 and 28 are excited by signals to be filtered over leads 32 and 33 from input buffer amplifier 29. The initial input signals to be filtered are connected to input terminal 31 which is connected to input point 30 of buffer 29.

The active low-pass filter elements include four pairs of transistors 34–35, 36–37, 38–39 and 40–41. Cascading is accomplished by connecting the collectors of the first pair to the emitters of the following pair and so on. Thus, collectors 47 and 48 are connected to emitters 50 and 49 respectively and so on. The filter circuits are completed by capacitors starting with capacitor 46 connected between emitters of a given pair. Current drive is provided by drive transistors 21 and 22 by connections between their collectors 25 and 26 and emitters 44 and 45 respectively. The filter transistors are suitably forward biased by a voltage divider connected between a suitable source of bias voltage, not shown, connected to terminal 55 between which and ground G is series connected resistors 56, 57, 58, 59, 60 and 61. Base 62 and the base of its companion transistor 35 is connected across resistor 61 to ground, and bases 63, 64 and 65 together with the bases of their companion transistors 37, 39 and 41 are connected along the divider adding resistors 60, 59 and 58 to the bias drop respectively.

The output of the low-pass filter proper is applied to a pair of output transistors 42–43 by connecting collectors 51 and 52 to emitters 54 and 53 respectively. Collectors 67 and 68 are energized by connecting them to bias terminal 55. Base 66 and the base of companion transistors 43 are provided with operating voltage by connecting them to the junction between divider resistors 56 and 57. The filter signal between emitters 53 and 54 is then applied over leads 70 and 69 respectively to the input of output buffer amplifier 71 and the final output appears at output terminal 72. An additional output from output terminal 75 of buffer amplifier 71 which is out of phase with the input signals to input buffer amplifier 29 is connected over lead 73 and through adjustable feedback resistor 74 to input terminal 76. Varying the value of resistor 74 provides low-pass filter response which may be changed to a resonant response at the cutoff frequency of the filter and even to a sustained oscillation. This then completes the details of the circuit connections of the low-pass filter, the functional operation of which is described above in the preamble to this application.

Figure 2:
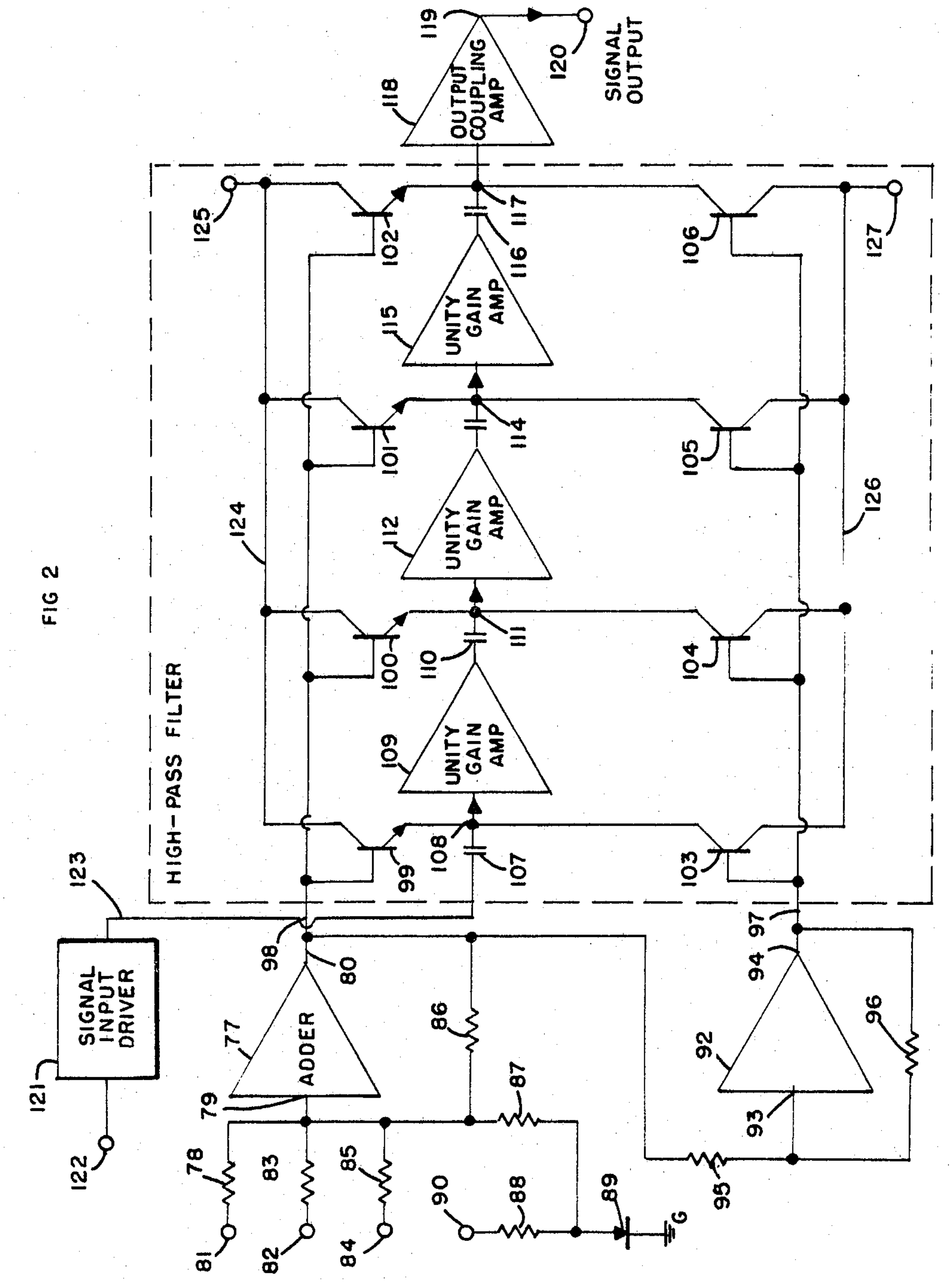
FIGURE 2 is a circuit diagram partly in block form of the high-pass portion of the present invention.

In FIGURE 2 detailing the high-pass filter the adder comprises operational amplifier 77 including an inverting input terminal 79 and an output terminal 80. Provision is made for three control input signals by means of terminals 81, 82 and 84 coupled to input 79 by means of input resistors 78, 83 and 85 respectively. Feedback is provided by resistor 86 connected from output 80 to input 79. The inverter includes operational amplifier 92 including inverting input 93 and output 94. The output of amplifier 77 is connected over lead 91 and through input resistor 95 to input 93. Feedback resistor 96 is connected from output 94 to input 93. By making resistors 95 and 96 equal, the gain of amplifier 92 is unity and the phase of its output is inverted with respect to its input. Thus, two equal and oppositely phased control voltages are provided, one at output 80 and the other at output 94. The operating point in the absence of control input voltages at terminals 81, 82 and 84 is set by diode 89 forward biased from a source of bias, not shown, applied to terminal 90 and coupled to diode 89 through current limiting resistor 88. The operating point bias across diode 89 is applied to input 79 through resistor 87.

The active elements of the high-pass filter include transistor pairs 99–103, 100–104, 101–105 and 102–106. The series capacitors include capacitors 107, 110, 113 and 116. Transistors 99, 100, 101 and 102 are NPNs while transistors 103, 104, 105 and 106 are PNPs. The collectors of transistors 99, 100, 101 and 102 are connected together over line 124 to a suitable source of positive bias, not shown. connected to terminal 125. The collectors of transistors 103, 104, 105 and 106 are connected together over line 126 to a source of negative bias, not shown, connected to terminal 127. The dynamic controlled resistances provided by these active filter transistors are coupled to the capacitors by connecting the emitters of the transistors forming each complementary pair to junction points 108, 111, 114 and 117. Unity gain amplifiers 109, 112 and 115 are connected between these junctions in turn and the following capacitors 110, 113 and 116 respectively. The oppositely polled inputs to the filter transistors are provided to the bases of transistors 99, 100, 101 and 102 connected together and to output 80 and the bases of transistors 103, 104, 105 and 106 connected together and to output 94.

The signals to be filtered are applied to input terminal 122 of signal input driver amplifier 121 the output of which is fed over lead 123 to capacitor 107 the input capacitor of the filter. The output of the high-pass filter at junction 117 is applied to the input of output coupling amplifier 118 the output of which at terminal 119 is applied to output terminal 120. This, then completes the description of circuit components constituting the high-pass filter the functioning of which is described above in the preamble of this application.

The electronically controlled low-pass and high-pass filters forming the major components of the circuitry of the present invention have been described in detail above. However, further important features of the present invention are provided by the coupling and switching unit to be described below.

Figure 3:
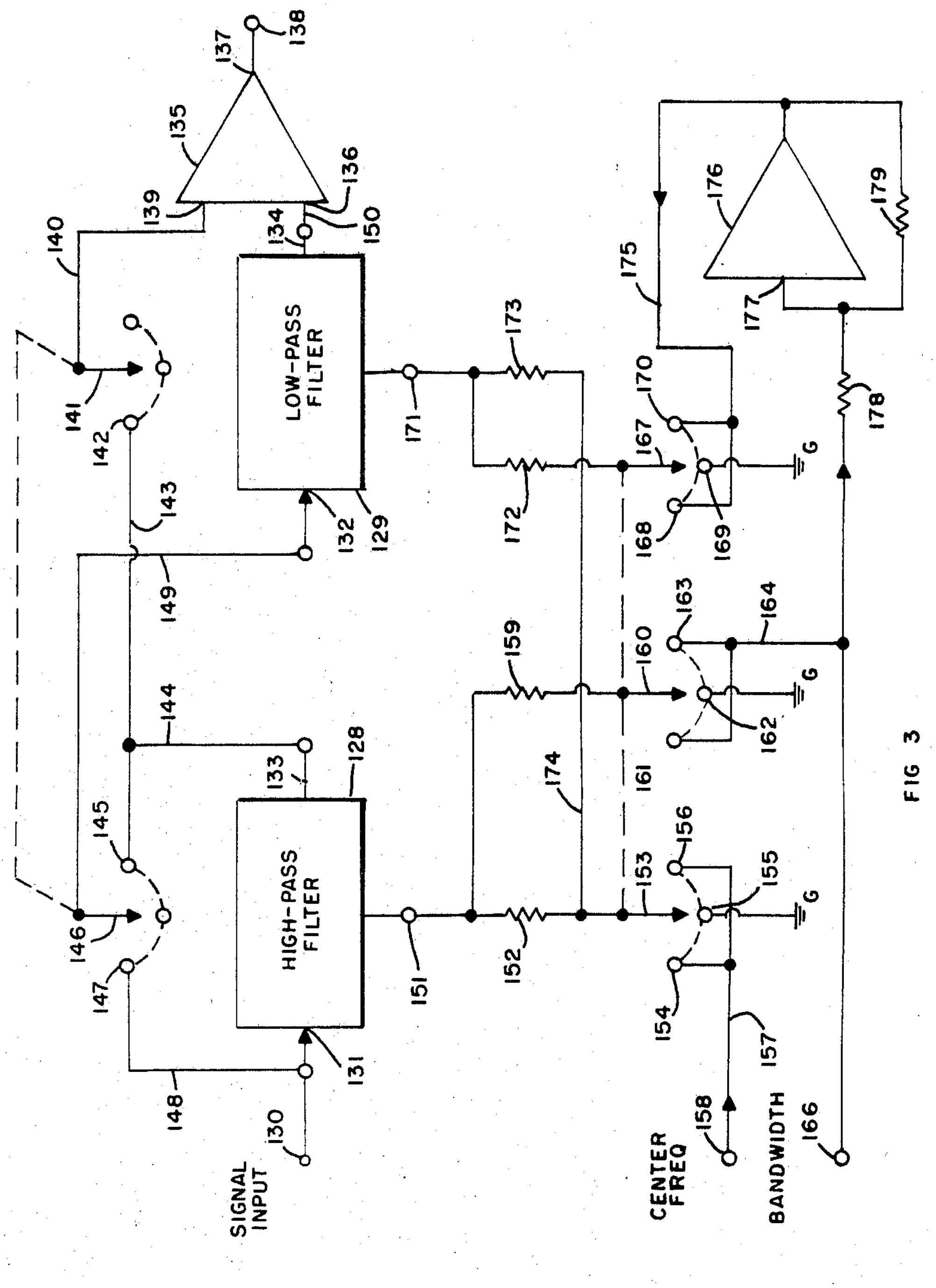
FIGURE 3 is a circuit diagram partly in block form of the coupling and control unit portion of the present invention.

FIGURE 3 shows one form of coupling and switching unit particularly suited to provide certain unique functions in combination with the high-pass filter 128 and the low-pass filter 129 described in detail above. In FIGURE 3 the representation of high-pass filter 128 has been simplified to include simply an input terminal 131 to receive the signals to be filtered, a control voltage input terminal 151 and an output terminal 133. Similarly, the low-pass filter 129 has been represented simply with a signal input terminal 132, a control voltage input terminal 171 and an output 134. The modes of operation are controlled by five-sections of three-position switches. The switches including contact arms 141 and 146 serve to connect the filters in series or parallel. When gauged arms 141 and 146 are switched to contacts 142 and 147 respectively the filters are connected in parallel. The output of low-pass filter 129 from terminal 134 is applied over line 150 to input 136 of output combining amplifier 135. The output of high-pass filter 128 from its output terminal 133 over leads 144, 143 and 140 to input 139 of amplifier 135. The filter outputs thus combined appear at output 137 and the connected final output terminal 138. When the two filters are connected in parallel, the result is a band-reject filter in which frequencies above the cutoff frequency of the low-pass filter and below the cutoff frequency of the high-frequency filter are rejected. The width of this rejection band is controlled by the control signals applied and utilized as described below.

When switches 141 and 146 are turned to their third positions, arm 141 is open and arm 146 closes to contact 145. This provides series connection of the two filters. The input applied to terminal 130 goes to input 131 of high-pass filter 128 and its output from terminal 133 passing via leads 144 and 149, arm 146 and contact 145 is applied to input 132 of low-pass filter 129. The output of low-pass filter 129 from output terminal 134 is applied over lead 150 to input 136 of output amplifier 135. Thus, the output from 137 at output terminal 138 is the result of signals traversing both filters in series. This mode of operation is a band-pass function since all frequencies which are both above the cutoff frequency of the high-pass filter and below the cutoff frequency of the low-pass filter are passed from input terminal 130 to output terminal 138. The width of this band-pass band may be electronically controlled as set forth below.

The three switches including contact arms 153, 160 and 167 are utilized to set the control functions and are ganged with the two switches described above. When arms 153, 160 and 167 close circuits with contacts 154, 161 and 168 respectively the control functions are adapted to control the band-pass filtering mode. Two control voltage input terminals are provided, namely terminals 158 and 166. Control voltage input terminal 158 is adapted to receive center frequency control voltage. Center frequency input control voltage applied to terminal 158 is conducted over lead 157, through arm 153 and contact 154 and through resistor 152 to control input terminal 151 of high-pass filter 128 and over lead 174 through resistor 173 to control input terminal 171 of low-pass filter 129. Resistors 152 and 173 are chosen to be equal so that a change in center frequency input control voltage changes the cutoff frequencies of the low-pass and high-pass filters together so that the rejection band between the two cutoff frequencies remains fixed in bandwidth. The bandwidth control voltage is applied to terminal 166 and connected over lead 165 through arm 160 and contact 161 through resistor 159 to control input 151 of high-pass filter 128 serves to vary the cutoff frequency of high-pass filter 128 in one direction; and through input resistors 178 to unity gain inverting operational amplifier 176 (as determined by feedback resistor 179) over lead 175, through switch arm 167 and contact 168 through resistor 172 to control input 171 of low-pass filter 129 serves to vary the cutoff frequency of the low-pass filter 129 in the opposite (opposite to the high-pass) direction. This function varies the cutoff frequencies of the two filters in opposite directions while maintaining the same center frequency.

The above center-frequency and band-width control functions are repeated with arms 153, 160 and 167 closed to contacts 156, 163 and 170 respectively.

Thus, the coupling and control unit provides means for providing either band-reject or band-pass characteristics and for controlling the center frequency with one control voltage and independently controlling the bandwidth with an independent control voltage. Resistors 152 and 159 comprise two of the adder input resistors of the high-pass filter while resistors 172 and 173 comprise two of the adder input resistors of the low-pass filter as shown in FIGURES 1 and 2.

The use of four sections in the high-pass and low-pass filters has special significance. The cutoff frequency of an RC filter occurs when the reactance of the capacitors is equal to the resistance of the resistors. This occurs at a phase angle of 45 degrees. On the other hand, a phase shift oscillator will oscillate at the frequency at which the sum of the phase shifts is 180 degrees. Thus, only in a phase shift oscillator with four sections will the oscillation frequency be equal to the cutoff frequency of each section. In a voltage-controlled filter such as the present high-pass and low-pass filters, the transition from filter mode to resonant and then to oscillatory modes occurs in such a way that the cutoff slope does not change in position and the resonance in the transfer function always occurs at the cutoff frequency. This does not occur with any other number of filter sections. For instance, in a filter with two sections, the resonant frequency is proportional to the square root of the loop gain.

Figure 4:
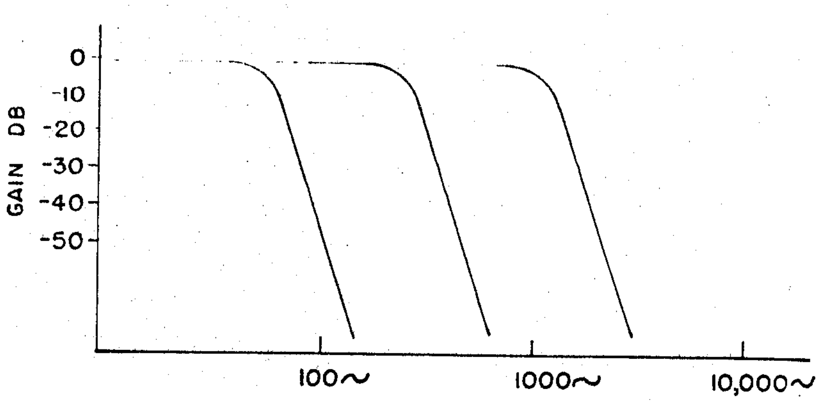
FIGURE 4 is a set of three response curves illustrating typical responses of the low-pass filter.

FIGURE 4 illustrates three typical responses of a low-pass filter in accordance with the present invention in which each curve is for a different control voltage. The mode illustrated is the unpeaked filter mode. It will be seen how the shape of the curves is the same independent of cutoff frequency. The range of possible cutoff frequencies is very large by means of the control voltages only while maintaining the same capacitors.

Figure 5:
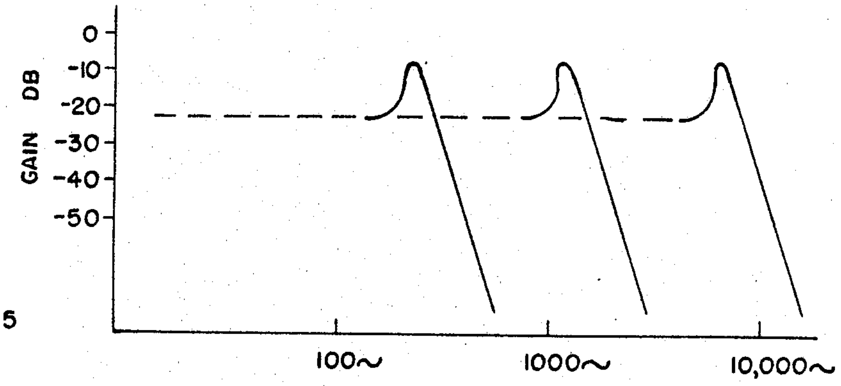
FIGURE 5 is a set of three response curves illustrating typical peaking mode responses of the high-pass filter.

FIGURE 5 illustrates the peaking mode of operation (available to either the low-pass or the high-pass filters) of the high-pass filter in accordance with the present invention as the control voltage is changed. It will be seen how the shape remains the same although the cutoff frequency is shifted over a wide range by means of the control voltage and without changing the capacitors.

Figure 6:
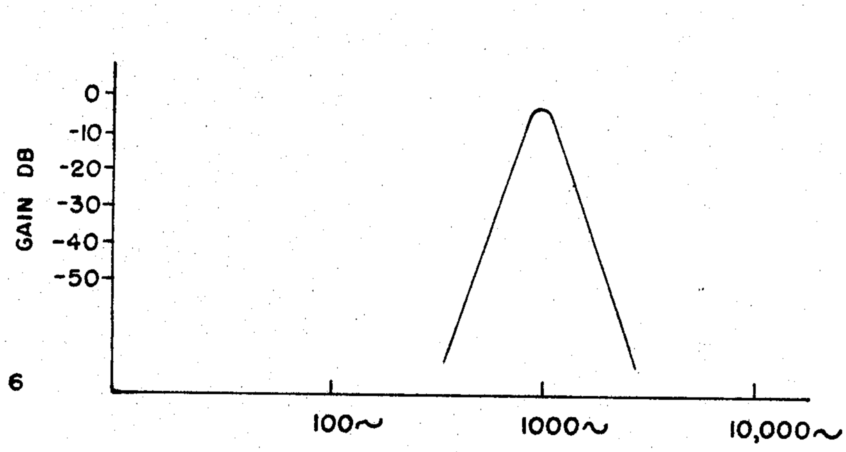
FIGURE 6 is a typical curve of a band-pass response obtained with the low-pass and high-pass filters connected in series.

FIGURE 6 illustrates one possible band-pass response in accordance with the present invention and obtained with the low-pass and high-pass filters connected in series.

While only a few forms of the present invention have been shown and described, many modifications will be apparent to those skilled in the art and within the spirit and scope of the invention as set forth, in particular, in the appended claims.

What is claimed is:

1. An RC filter comprising a plurality of capacitors connected to provide the capacity elements of the filter and a plurality of bipolar transistors connected with said capacitors to utilize the essentially exponential resistance of the base to emitter diodes of said transistors as voltage controllable resistance elements of the RC filter.

2. An RC filter as set forth in claim 1 and including means for controlling the standing current of said transistors for controlling the cutoff frequency of said filter.

3. An RC filter as set forth in claim 1 and including a feedback path from the output of said filter to the input of said filter for peaking the response of said filter at substantially the cutoff frequency.

4. An RC filter as set forth in claim 1 and including feedback means for causing said filter to oscillate at substantially the cutoff frequency of said filter.

5. An RC filter as set forth in claim 1 wherein said RC elements are connected to form a low-pass filter.

6. An RC filter as set forth in claim 1 wherein said RC elements are connected to form a high-pass filter.

7. In a band-pass/elimination filter, the combination of, an RC low-pass filter, an RC high-pass filter, selectable means for alternatively connecting said filters in series and in parallel, wherein the resistance elements providing the R's of said RC filters comprise the base-to-emitter diode resistances of a plurality of bipolar transistors, input means for applying signals to be filtered to said filters and output means for applying the filtered output of said filters to a utilization means.

8. A band-pass/elimination filter as set forth in claim 7 and including means for controlling the standing current of said transistors for controlling the cutoff frequencies of said filters.

9. An RC filter as set forth in claim 1 comprising 4 sections wherein the phase shift of said filter at the cutoff frequency is substantially 180 degrees.

10. An RC filter as set forth in claim 1 and including means for supplying standing current to said transistors by means of current supply connections to the emitters of a pair of transistors comprising the input transistors of said filter.

11. In an RC filter comprising in combination;

a plurality of fixed capacitors forming the capacitative elements of the filter and a plurality of bipolar transistors connected to said capacitors in a manner to use the base to emitter diodes of said transistors as the resistive elements of the filter;

means for providing standing current to said transistors;

means for controlling said standing current whereby the base to emitter resistance of said transistors is controlled for controlling the characteristics of said filter;

means for applying signals to be filtered to the input of said filter;

and means for deriving the filtered output of said filter and for applying said output to a utilization means.

12. An RC filter as set forth in claim 11 wherein said means for controlling the standing current includes a summing operational amplifier.

13. An RC filter as set forth in claim 11 wherein said means for applying signals includes an input buffer and said means for deriving the filtered output includes an output buffer.

14. An RC filter as set forth in claim 11 wherein the filter is a high-pass filter.

15. An RC filter as set forth in claim 11 wherein the filter is a low-pass filter.

16. In a band-pass filter the combination of two filters as set forth in claim 11, one being a high-pass filter and the other a low-pass filter;

means for controlling the center frequency of the band-pass filter;

and means for controlling the band-width of the band-pass filter.

References Cited

UNITED STATES PATENTS

| | | | |
|---|---|---|---|
| 3,070,762 | 12/1962 | Evans. | |
| 3,363,177 | 1/1968 | Houghton | 330—15 |

DONALD D. FORRER, Primary Examiner

DAVID M. CARTER, Assistant Examiner

U.S. Cl. X.R.

307—229, 295; 333—70